United States Patent [19]

Chabert et al.

[11] Patent Number: 5,285,355

[45] Date of Patent: Feb. 8, 1994

[54] DEVICE FOR REMOVABLY FIXING AN ELECTRIC MODULE ON A SUPPORT

[75] Inventors: Jean-Marie Chabert, Valbonne; André Goletto, Antibes, both of France

[73] Assignee: Telemecanique, France

[21] Appl. No.: 976,028

[22] Filed: Nov. 13, 1992

[30] Foreign Application Priority Data

Nov. 14, 1991 [FR] France .................. 91-13997

[51] Int. Cl.⁵ .................................. H05K 1/11
[52] U.S. Cl. ................... 361/784; 361/679; 361/752; 361/736; 174/17 R; 174/50; 439/62; 439/64; 257/678
[58] Field of Search ............... 361/380, 390–393, 361/397, 399, 412, 415, 679, 724–726, 729, 736, 748, 752, 784; 174/255, 260, 50, 17 R; 439/64, 74, 62, 43; 257/678

[56] References Cited

U.S. PATENT DOCUMENTS

| | | | |
|---|---|---|---|
| 3,798,507 | 3/1974 | Damon et al. | 317/101 DH |
| 4,502,047 | 2/1985 | Fujiwara et al. | 340/693 |
| 4,510,552 | 4/1985 | Kanno et al. | 361/413 |
| 4,628,413 | 12/1986 | Speraw | 361/415 |
| 4,672,511 | 6/1987 | Meusel et al. | 361/415 |
| 4,731,702 | 3/1988 | Hiatt et al. | 361/391 |
| 4,956,750 | 9/1990 | Maggelet | |

FOREIGN PATENT DOCUMENTS

| | | |
|---|---|---|
| 0162373 | 11/1985 | European Pat. Off. |
| 0236711 | 9/1987 | European Pat. Off. |
| 3632470 | 3/1988 | Fed. Rep. of Germany |

Primary Examiner—Leo P. Picard
Assistant Examiner—Young Whang
Attorney, Agent, or Firm—William A. Drucker

[57] ABSTRACT

Modular electronic unit comprised of pivotably mounted modules leaning against a support in the form of a plate, notably for programmable controllers. A tightening spring is placed between the housing of each module and the support, near the lower rear end of the housing, and is gradually brought under stress by pressing on a heel during pivoting of the module, while stops of the housing come and rest frontally against the web plate of the support.

10 Claims, 3 Drawing Sheets

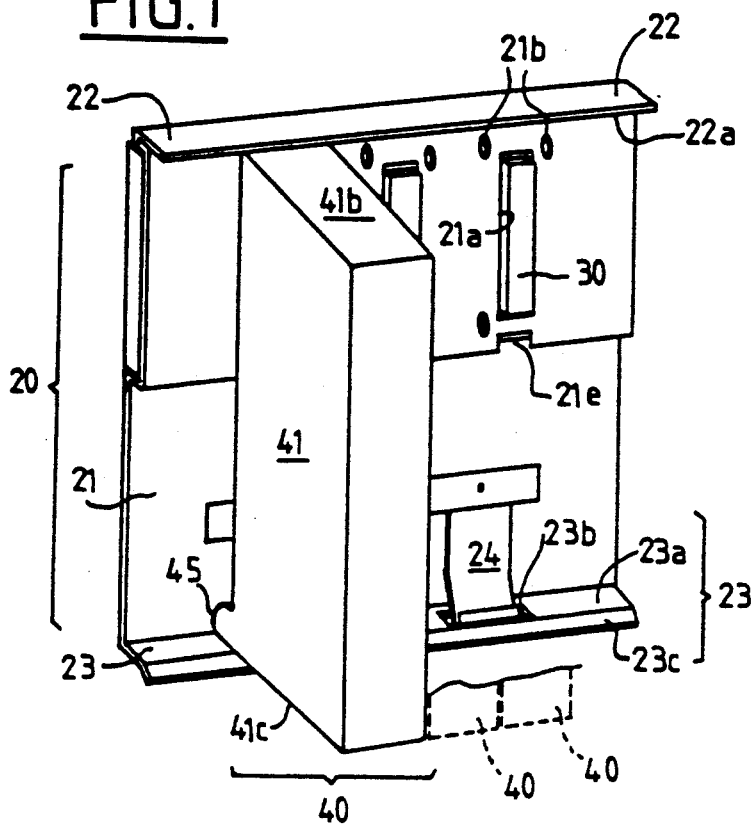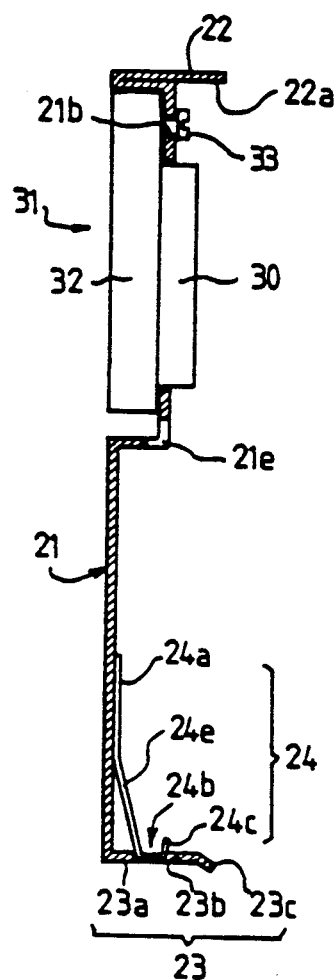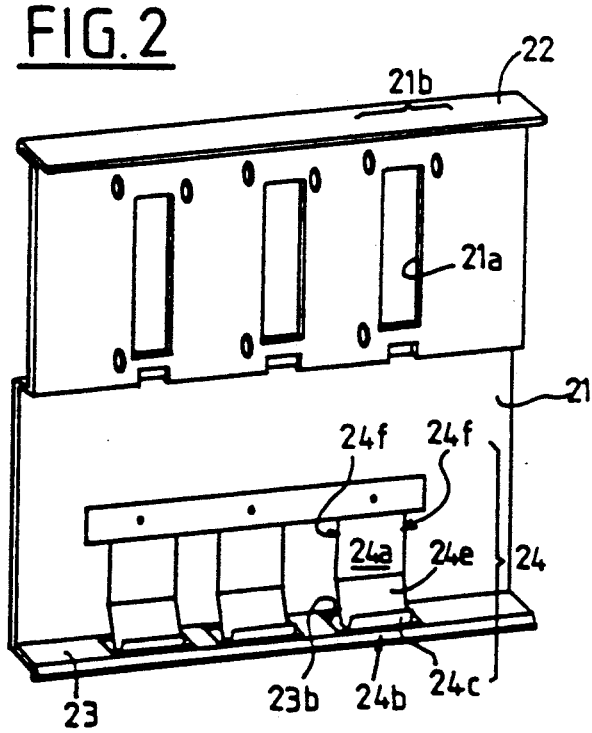

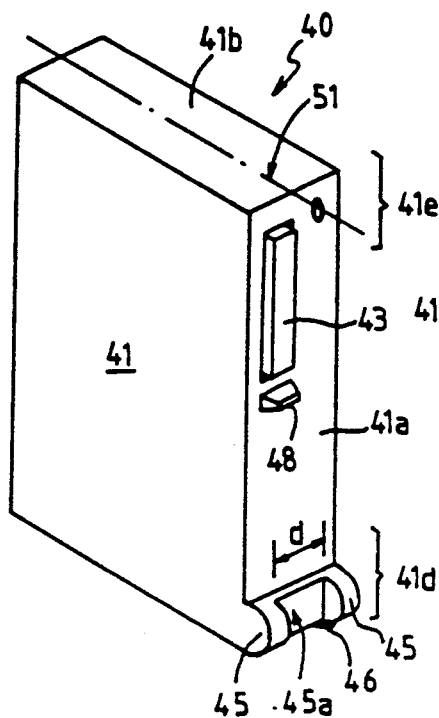
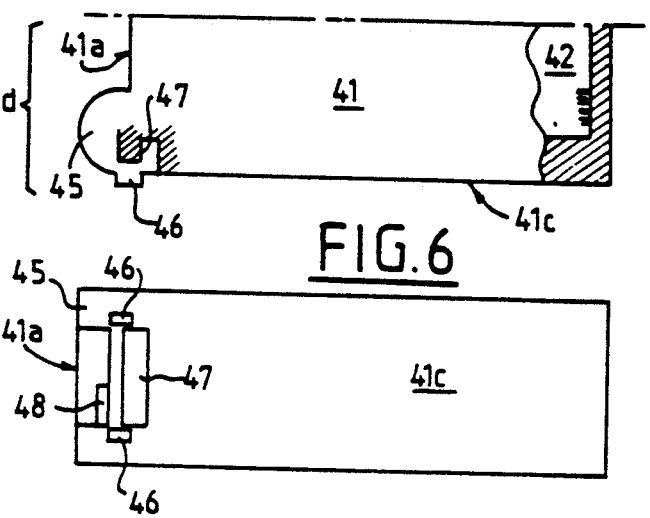
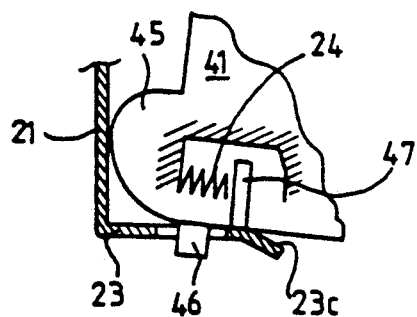
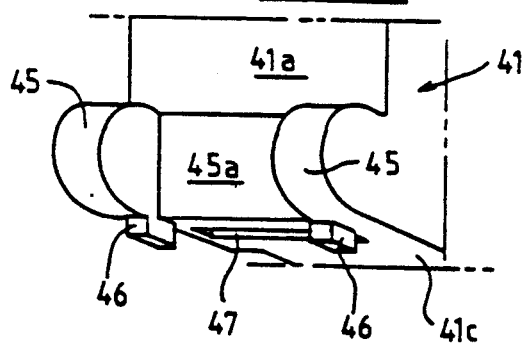

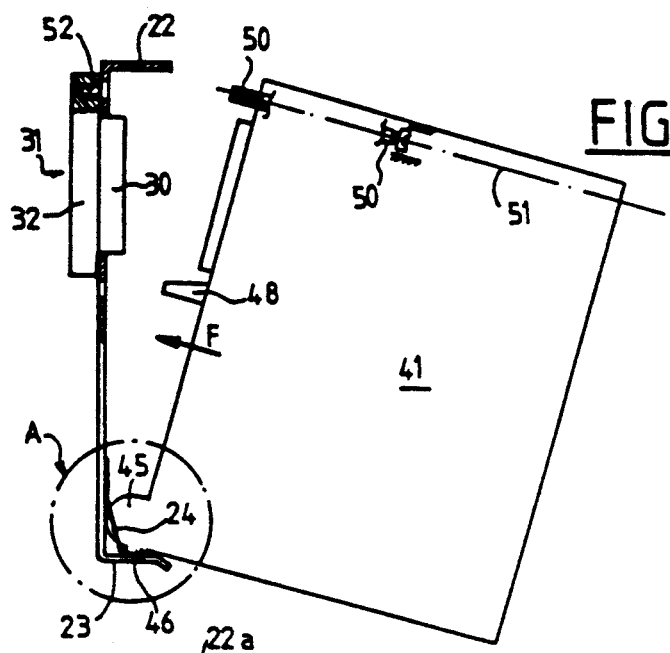
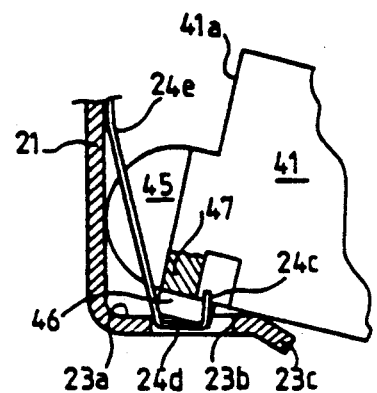
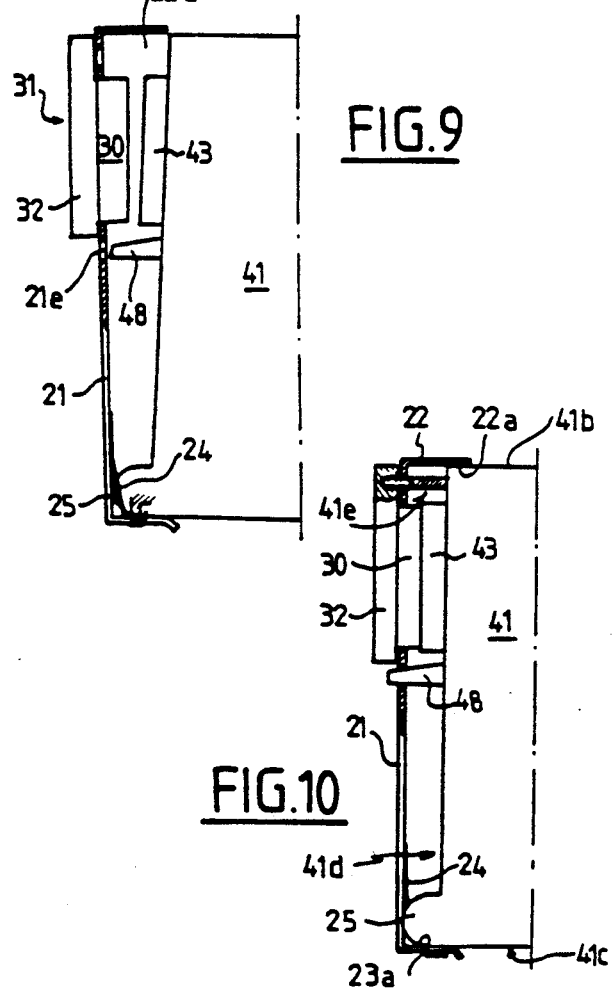
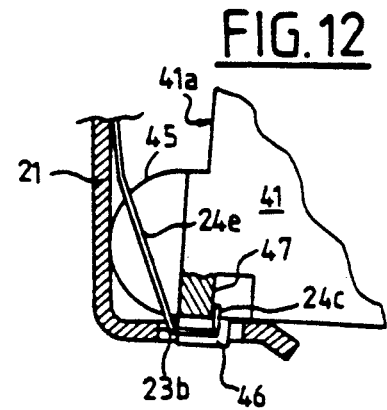
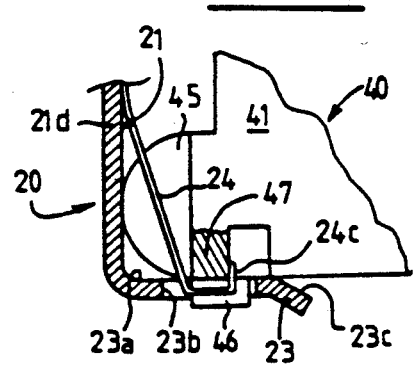

DEVICE FOR REMOVABLY FIXING AN ELECTRIC MODULE ON A SUPPORT

BACKGROUND OF THE INVENTION

1 Field of the Invention

This invention relates to a modular electronic unit notably, though not exclusively, applicable to devices for the control of automatic operations such as programmable controllers.

2 Description of the Prior Art

Certain modular-structured programmable controllers comprise, for the purposes of convenient individual mounting and dismounting:

pivotably mounted electronic modules each comprising a housing containing a PC board and having, towards a rear vertical side, a connector, a module supporting device in the form of a plate having a vertical web plate fitted with connectors for cooperating with the connectors of the modules and, for each module, a mainstay against which the latter can be applied and pivoted, and means for positioning and securing the module to the support.

Such a construction is notably known through European patent No. 162,373. In such a solution, pivot bearings provided in the upper part of the housing are placed on a ridge bearing the support and withstand most of the mounting strains transmitted by the operator; they therefore risk being deteriorated or broken. Furthermore, springs are provided near the upper and lower ends of the support, but merely serve the purpose of electrical contact, to the extent that the fastening of each module requires two fastening bolts respectively situated at the upper and lower ends of the housing.

OBJECT OF THE INVENTION

The main object of this invention is to relieve the pivoting means and to simplify the putting into position and fastening of the module to the support.

SUMMARY OF THE INVENTION

According to the invention, the applying and pivoting means comprises:

a fitting side of the housing, cooperating with a horizontal bearing side situated at the first end of the support, the fitting side being horizontally moveable on the bearing side;

a stop of the housing applying frontally against a front part of the web plate of the support and remaining applied against the web plate during pivoting of the module, a tightening spring placed between the housing and the support and cooperating with a bearing surface in such a way as to have stress gradually brought to bear upon it during pivoting of the module.

The first end of the housing and of the support can advantageously be their lower end and the horizontal bearing side can be formed by a lower horizontal fascia of the support, with a slanted edge facilitating oblique presentation of the modules.

The spring can be a leaf spring secured to the support that can be caught by a heel of the housing or a compression spring lodged in the housing of the module and stressed by a protruding part of the bearing fascia.

A horizontal guide fascia is advantageously provided at the second end of the support for maintaining the corresponding rear end of the module housing during pivoting.

BRIEF DESCRIPTION OF THE DRAWINGS

Further features and advantages of the invention will be apparent from the following particular description of several preferred embodiments of this invention as illustrated in the corresponding accompanying drawings in which:

FIG. 1 represents in perspective an electronic unit embodying the invention;

FIG. 2 shows in perspective the support of the unit in FIG. 1, without any module or rear connection unit;

FIG. 3 is a lateral upright projection of the unit of FIG. 1 with the modules removed;

FIG. 4 is a perspective view from the rear of a module;

FIGS. 5 and 6 are respectively a side view and bottom view of this module;

FIG. 7 is a magnified perspective view from below of a detail of the module;

FIGS. 8 to 10 shows the different stages of the mounting of a module onto the support, in an embodiment with a flat web plate;

FIGS. 11 to 13 show detail A during these respective stages;

FIG. 14 represents the same detail in another embodiment.

DESCRIPTION OF THE PREFERRED EMBODIMENTS

The modular electronic unit 10 illustrated in these figures is a device for controlling automatic operations such as a programmable controller. It could, of course, be used in other control and command applications.

The unit 10 comprises a support 20, and electronic input, output, communication or other modules 40 fixed to the support at a certain number of places. Just one module is shown in full lines in FIG. 1 for the purposes of the clarity of the drawing.

The support 20 is a metal plate, preferably cut and bent, having a web plate 21, an upper fascia 22 and a lower fascia 23. The vertical web plate 21 is fitted with windows 21a for receiving connectors 30 that will be described hereinafter, and is fitted with various attachment holes 21b. The upper guide fascia 22 has a horizontal underside 22a which contributes to guiding and maintaining the modules. The lower bearing fascia 23 has a horizontal upper side 23a in which openings 23b are provided and which is bordered by a ramp 23c sloping forward, i.e. towards the introduction side of the modules.

Leaf-type tightening springs 24 are provided equal in number to the number of modules to be fixed to the support. Each spring 24 (see FIG. 3) has a first end 24a secured by all usual means to the web plate 21 and a second end 24b fitted with a vertical catching edge 24c and a horizontal portion 24d. This portion 24d is connected to an oblique intermediary part 24e of the spring and, in order to gain height, is lodged in the opening 23b for displacement there when the module pivots while being hooked onto the edge 24c. The front and rear edges of the opening 23b serve as stops for the end 24b of the spring in order to restrict clearance of the latter.

The connectors 30 are part of a set rear connection unit 31 of which the housing 32 is lodged at the rear of the web plate 21, e.g. in a space provided by an advanced upper part of the web plate 21. The housing 32 is attached to the support 20 by bolts 33 going through holes 21b.

The connectors 30 can also be interconnected by flexible cables. In an embodiment of simpler construction (FIGS. 8 to 10), the web plate 21 is flat.

Each module 40 has a housing 41 which lodges an electronic processing board 42 with a printed circuit connectable from the front to external devices such as sensors or actuators via a front terminal block which is not represented, and, from the rear to the set connector 30 via a series of pin connectors bordering the board or via an additional rear connector 43.

The housing 41 (see FIGS. 4 to 7) has a rear side 41a, an upper side 41b and an underside 41c. At the lower end 41d of its substantially plane rear side 41a can be found, on the one hand, two stops 45, said stops constituting cams which come into play in the process bringing stress to bear on the spring, and, on the other hand, two pins 46 for positioning in opening 23b. The stops 45 have a cam surface of suitable profile enabling, during pivoting of the module, leaning against the web plate 21 for pulling and deflection of the spring. The pins 46 are intended for insertion into the openings 23b and apply themselves against the lateral edges of the latter for positioning the housing 41. In addition, the width d of the space 45a provided between the pins enables the module housing to be centered with regard to the spring 24 due to the contact of the inner sides of the stops 45 against the lateral edges 24f of the blade.

Furthermore, a span 47, e.g. a heel, is provided at the lower part 41d of the housing 41 for catching the spring shoulder 24c in order to gradually stress it during pivoting. An additional positioning element 48 with ramps 49 is provided at the rear of the housing for centering in a hole 21e situated mid-way up the web plate 21.

The mounting of a module 40 onto the support 20 will be explained with regard to FIGS. 8 to 13 which show an embodiment of a support with a flat web plate.

The housing 41 of the module 40 is presented slanted (FIGS. 8 and 11) in such a way that the stops or cams 45 are applied on either side of the intermediary part 24e of the leaf spring 24 for pre-positioning, then against the lower part 21d of the web plate 21. The pins 46 are engaged in the opening 23b of the fascia 23, in contact with at least one of the edges of this opening, which contributes to the positioning of the module, and the heel 47 engages behind the catching edge 24c (FIGS. 9 and 12). As the operator then pivots the housing 41 in the anticlockwise direction of the figures, the surface of the cams 45 displaces itself slightly onto the web plate 21, while the heel 47 pulls the shoulder 24c of the spring to the right. The end 24b of the spring and the tenons 46 move in the opening 23b which is dimensioned accordingly. The positioning element 48 enters the hole 21e before the connector 43, belonging to the housing 41, fits onto the set connector 30, in order to contribute to properly fitting these connectors together. The upper surface 41b of the housing 41 slides against the lower surface 22a of the fascia 22, while the lower surface 41c of the housing continues to rest against the upper surface 23a of fascia 23.

The bringing of stress to bear on the spring 24 and the associated positioning means satisfactorily secure the lower rear end 41d of the housing, while its upper rear end 41e is attached to the web plate 21 by tightening an axis 51 bolt 50 in a nut 52 mounted behind the web plate or in the housing 32. In practice, a single fastening bolt at the upper end of the module is sufficient for proper attachment of the module to the support, in conjunction with the described securing of its lower end. Dismounting of the housing 41 is the reverse of the foregoing description of mounting.

The dispositions provided for the lower and upper ends of the housing could be reversed, with the spring being placed and stress brought to bear on it on an upper fascia of the support. The spring can be placed in front of or behind the web plate.

In the embodiment illustrated in FIG. 14, the spring 24 is a compression spring lodged in a recess of the housing 41 in the lower end 41d of the latter. The free end of the spring 24 rests, after placing of the housing on the surface 23a of the bearing fascia 23, against a bearing surface 47 comprised of a projection of the support, e.g. of the fascia 23.

We claim:

1. A device for removably fixing at least one electronic module which comprises a housing containing a printed circuit board, on a support having a vertical web plate provided with connecting means located so as to cooperate with corresponding connecting means of said module, said support further having means for fixing by pivoting said module thereon,
wherein said device comprises at a first end of said housing:
 - a fitting side cooperating with a horizontal bearing side situated at a first end of said support, and being horizontally moveable on said horizontal bearing side;
 - a stop applying frontally against a front part of said vertical web plate and remaining applied against said vertical web plate during pivoting of said electronic module,
 - a tightening spring placed between said housing and said support and cooperating with a bearing surface in such a way as to have stress gradually brought to bear upon it during pivoting of said electronic module.

2. The device as claimed in claim 1, wherein said first end of said housing and of said support is a lower end and said horizontal bearing side is formed by a lower horizontal fascia of said support.

3. The device as claimed in claim 2, wherein said lower horizontal fascia has a front part forming a slanted edge.

4. The device as claimed in claim 2, wherein at least one positioning pin is provided at a lower rear end of said housing for lodging in an opening of said lower horizontal fascia.

5. The device as claimed in claim 1, wherein said tightening spring is a leaf spring having a first end secured to said support and a second end fitted with a catching conformation cooperating with a heel connected to said housing.

6. The device as claimed in claim 5, wherein said leaf spring has lateral edges which constitute means for positioning said electronic module on said support.

7. The device as claimed in claim 5, wherein said second end of said leaf spring is lodged in an opening of said lower horizontal fascia.

8. The device as claimed in claim 2, wherein said tightening spring is a compression spring lodged in said housing which is stressed at one end by a protruding part extending from said lower horizontal fascia.

9. The device as claimed in claim 1, wherein an upper end of said support comprises a guide fascia for maintaining an upper rear end of said housing during pivoting.

10. The device as claimed in claim 1, wherein said fixing means comprises a single bolt situated at a second end of said housing.

* * * * *